(12) United States Patent
Blankenship et al.

(10) Patent No.: US 7,343,548 B2
(45) Date of Patent: *Mar. 11, 2008

(54) METHOD AND APPARATUS FOR ENCODING AND DECODING DATA

(75) Inventors: Yufei W. Blankenship, Streamwood, IL (US); T. Keith Blankenship, Streamwood, IL (US); Brian K. Classon, Palatine, IL (US)

(73) Assignee: Motorola, Inc., Schaumburg, IL (US)

( * ) Notice: Subject to any disclaimer, the term of this patent is extended or adjusted under 35 U.S.C. 154(b) by 480 days.

This patent is subject to a terminal disclaimer.

(21) Appl. No.: 11/108,949

(22) Filed: Apr. 19, 2005

(65) Prior Publication Data
US 2006/0129904 A1    Jun. 15, 2006

Related U.S. Application Data

(60) Provisional application No. 60/636,700, filed on Dec. 15, 2004.

(51) Int. Cl.
*H03M 13/00* (2006.01)
*G06F 11/00* (2006.01)

(52) U.S. Cl. .................. 714/800; 714/752; 714/758

(58) Field of Classification Search ............... 714/752, 714/758, 800, 804
See application file for complete search history.

(56) References Cited

U.S. PATENT DOCUMENTS

| 6,718,508 B2 | 4/2004 | Lodge et al. |
| 7,188,297 B2 * | 3/2007 | Blankenship et al. ........ 714/758 |
| 7,260,763 B2 * | 8/2007 | Sukhobok et al. .......... 714/758 |

FOREIGN PATENT DOCUMENTS

WO    2004/102810 A1    11/2004

* cited by examiner

*Primary Examiner*—Guy J. Lamarre (57) ABSTRACT

A structured parity-check matrix H is proposed, wherein H is an expansion of a base matrix $H_b$. Base matrix $H_b$ comprises a section $H_{b1}$ and a section $H_{b2}$. Section $H_{b2}$ comprises column $h_b$ having weight $w_h \geq 3$ and $H'_{b2}$ having a dual-diagonal structure with matrix elements at row i, column j equal to 1 for i=j, 1 for i=j+1, and 0 elsewhere. The 1's of $h_b$ and $H_{b1}$ are arranged such that one or more groups of the rows of $H_b$ can be formed so that the rows of $H_b$ within each group do not intersect. Further more, the rows of base matrix $H_b$ can be permuted such that every two consecutive rows do not intersect.

20 Claims, 4 Drawing Sheets

METHOD AND APPARATUS FOR ENCODING AND DECODING DATA

FIELD OF THE INVENTION

The present invention relates generally to encoding and decoding data and in particular, to a method and apparatus for encoding and decoding data utilizing low-density parity-check (LDPC) codes.

BACKGROUND OF THE INVENTION

As described in U.S. patent application Ser. No. 10/839,995, which is incorporated by reference herein, a low-density parity-check (LDPC) code is a linear block code specified by a parity-check matrix H. In general, an LDPC code is defined over a Galois Field GF(p), $p \geq 2$. If p=2, the code is a binary code. All linear block codes can be described as the product of a k-bit information vector $s_{1 \times k}$ with a code generator matrix $G_{k \times n}$ to produce an n-bit codeword $x_{1 \times n}$ where the code rate is r=k/n. The codeword x is transmitted through a noisy channel, and the received signal vector y is passed to the decoder to estimate the information vector $s_{1 \times k}$.

Given an n-dimensional space, the rows of G span the k-dimensional codeword subspace C, and the rows of the parity-check matrix $H_{m \times n}$ span the m-dimensional dual space $C^{\perp}$, where m=n−k. Since x=sG and $GH^T=0$, it follows that $xH^T=0$ for all codewords in subspace C, where "T" (or "T'") denotes matrix transpose. In the discussion of LDPC codes, this is generally written as $$Hx^T = 0^T, \quad (1)$$

where 0 is a row vector of all zeros, and the codeword $x=[s\ p]=[s_0, s_1, \ldots, s_{k-1}, p_0, p_1, \ldots, p_{m-1}]$, where $p_0, \ldots, p_{m-1}$ are the parity-check bits; and $s_0, \ldots, s_{k-1}$ are the systematic bits, equal to the information bits within the information vector.

For an LDPC code the density of non-zero entries in H is low, i.e., there are only a small percentage of 1's in H, allowing better error-correcting performance and simpler decoding than using a dense H. A parity-check matrix can be also described by a bipartite graph. The bipartite graph is not only a graphic description of the code but also a model for the decoder. In the bipartite graph, a codeword bit (therefore each column of H) is represented by a variable node on the left, and each parity-check equation (therefore each row of H) is represented by a check node on the right. Each variable node corresponds to a column of H and each check node corresponds to a row of H, with "variable node" and "column" of H referred to interchangeably, as are "check node" and "row" of H. The variable nodes are only connected to check nodes, and the check nodes are only connected to variable nodes. For a code with n codeword bits and m parity bits, variable node $v_i$ is connected to check node $c_j$ by an edge if codeword bit i participates in check equation j, $i=0, 1, \ldots, n-1$, $j=0, 1, \ldots, m-1$. In other words, variable node i is connected to check node j if entry $h_{ji}$ of the parity-check matrix H is 1. Mirroring Equation (1), the variable nodes represent a valid codeword if all check nodes have even parity.

An example is shown below to illustrate the relationship between the parity-check matrix, the parity-check equations, and the bipartite graph. Let an n=12, rate-½ code be defined by $$H = \begin{bmatrix} 1 & 0 & 1 & 0 & 0 & 0 & 1 & 1 & 0 & 0 & 0 & 0 \\ 0 & 1 & 0 & 0 & 1 & 0 & 0 & 1 & 1 & 0 & 0 & 0 \\ 0 & 0 & 1 & 0 & 0 & 1 & 1 & 0 & 1 & 1 & 0 & 0 \\ 1 & 0 & 0 & 1 & 0 & 0 & 0 & 0 & 0 & 1 & 1 & 0 \\ 0 & 1 & 0 & 0 & 1 & 0 & 0 & 0 & 0 & 0 & 1 & 1 \\ 0 & 0 & 0 & 1 & 0 & 1 & 1 & 0 & 0 & 0 & 0 & 1 \end{bmatrix} \biggr\} m, \quad (2)$$

with the left side portion corresponding to k (=6) information bits s, the right side portion corresponding to m (=6) parity bits p. Applying (1), the H in (2) defines 6 parity-check equations as follows:

$$\begin{cases} x_0 + x_2 + x_6 + x_7 = 0 \\ x_1 + x_4 + x_7 + x_8 = 0 \\ x_2 + x_5 + x_6 + x_8 + x_9 = 0 \\ x_0 + x_3 + x_9 + x_{10} = 0 \\ x_1 + x_4 + x_{10} + x_{11} = 0 \\ x_3 + x_5 + x_6 + x_{11} = 0 \end{cases} \quad (3)$$

Figure 1:
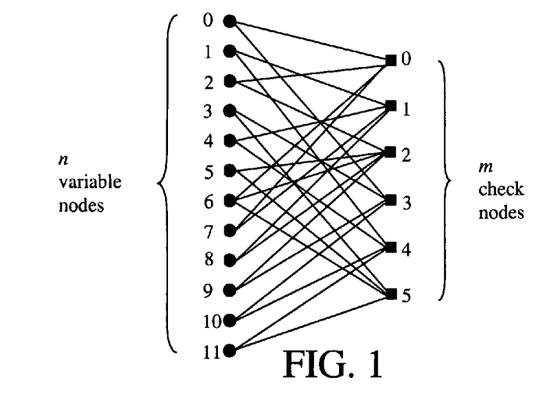
FIG. 1 illustrates the bipartite graph of an (12, 6) H matrix.

H also has the corresponding bipartite graph shown in FIG. 1.

The general LDPC code described above may not be easy to implement in practice. Structures are often introduced into the parity-check matrix to allow fast encoding and decoding without sacrificing the error-correcting performance. A structured LDPC code design starts with a small $m_b \times n_b$ binary base matrix $H_b$, makes z copies of $H_b$, and interconnects the z copies to form a large m×n H matrix, where $m=m_b \times z$, $n=n_b \times z$. Using the matrix representation, to build an H from $H_b$ each 1 in $H_b$ is replaced by a z×z permutation submatrix, and each 0 in $H_b$ is replaced by a z×z all-zero submatrix. The representation of the expansion of $H_b$ is called the model matrix and is denoted by $H_{bm}$. Thus $H_{bm}$ is simply a shorthand notation for H when z is known. This procedure essentially maps each edge of $H_b$ to a vector edge of length z in H, each variable node of $H_b$ to a vector variable node of length z in H, and each check node of $H_b$ to a vector check node of length z in H. For a structured LDPC, the z×z submatrix may be a permutation matrix, a sum of permutation matrices, or any type of binary matrix. Since a permutation matrix P has a single 1 in each row and a single 1 in each column, the weight distribution of the expanded matrix H is the same as the base matrix $H_b$. Therefore, the weight distribution of $H_b$ is chosen as close to the desired final weight distribution as possible. The permutation submatrices comprising H can be very simple without compromising performance, such as simple cyclic shifts and/or bit-reversals. In the case of cyclic shifts, $H_{bm}$ can be written by replacing the 1's in $H_b$ by non-negative integers that represent the shift sizes and replacing the 0's in $H_b$ by −1.

In the transmitter, a vector s of k information bits is encoded based on H (or equivalently $H_{bm}$) to produce a vector x of n code bits, where $k=n-m=z \times k_b$, $k_b=(n_b-m_b)$. Vector x is sent through a noisy channel and a vector y of n contaminated signals are received. At the receiver, the LDPC decoder attempts to estimate s based on received vector y and the parity-check matrix H. To decode y and estimate the original information sequence s, an iterative decoding algorithm, such as belief propagation, is usually applied based on the bipartite graph. Soft information in the format of log-likelihood ratios (LLRs) of the codeword bits is passed between the bank of variable nodes and the bank of check nodes. The iteration is stopped either when all check equations are satisfied or a maximum allowed iteration limit is reached.

Structured LDPC codes may also be decoded with a layered decoder. A layered decoder typically has hardware to processes an entire vector row at one time. The layered decoder can potentially reduce the number of iterations required to achieve a given level of performance, thereby improving throughput.

In addition, the base matrix and assignment of permutation matrices for a given target parity check matrix H can be designed to provide an LDPC code that has good error-correcting performance and can be efficiently encoded and decoded. In U.S. patent application Ser. No. 10/839,995, a structured parity-check matrix H is described, wherein H is an expansion of a base matrix $H_b$ and wherein $H_b$ comprises a section $H_{b1}$ and a section $H_{b2}$, and wherein $H_{b2}$ comprises a first part comprising a column $h_b$ having an odd weight greater than 2, and a second part comprising matrix elements for row i, column j equal to 1 for i=j, 1 for i=j+1, and 0 elsewhere. The expansion of the base matrix $H_b$ uses identical submatrices for 1's in each column of the second part $H'_{b2}$, and the expansion uses paired submatrices for an even number of 1's in $h_b$.

Although layered decoding can be used to potentially reduce the amount of processing and potentially increase throughput, a technique does not exist for designing $H_b$ and assigning the permutation matrices for a given target H size which allows efficient encoding and layered decoding. Therefore, a need exists for building features into structured LDPC codes which can be encoded efficiently and high-speed layered decoded.

DETAILED DESCRIPTION OF THE DRAWINGS

To address the above-mentioned need, a method and apparatus of encoding and decoding data is provided herein. More particularly, H is an expansion of a base matrix $H_b$ having $m_b$ rows. $H_b$ comprises a section $H_{b1}$ and a section $H_{b2}$, and $H_{b2}$ comprises column $h_b$ having weight $w_h \geq 3$ and $H'_{b2}$ having a dual-diagonal structure with matrix elements at row i, column j equal to 1 for i=j, 1 for i=j+1, and 0 elsewhere. The 1's of $h_b$ and $H_{b1}$ are arranged such that one or more groups of the rows of $H_b$ can be formed so that rows within each group do not intersect. In other words, the rows of $H_b$ within each group do not have positive values in the same column.

By designing $H_b$ as described, a pipelined hardware decoder can be constructed. Such a decoder can process multiple vector rows of H at a time, since the updated messages of a group are not required to update the messages of a subsequent group. By pipelining, the decoder can achieve significantly higher throughput without increasing hardware complexity.

The present invention encompasses a method for operating a transmitter that generates parity-check bits $p=(p_0, \ldots, p_{m-1})$ based on a current symbol set $s=(s_0, \ldots, s_{k-1})$. The method comprises the steps of receiving the current symbol set $s=(s_0, \ldots, s_{k-1})$, using a matrix H to determine the parity-check bits, and transmitting the parity-check bits along with the current symbol set. In the preferred embodiment of the present invention H is an expansion of a base matrix $H_b$ having $m_b$ rows with $H_b$ comprising a section $H_{b1}$ and a section $H_{b2}$, and $H_{b2}$ comprises column $h_b$ having weight $w_h \geq 3$ and $H'_{b2}$ having a dual-diagonal structure with matrix elements at row i, column j equal to 1 for i=j, 1 for i=j+1, and 0 elsewhere; wherein 1's of $h_b$ and $H_{b1}$ are arranged such that one or more groups of the rows of $H_b$ can be formed so that rows of $H_b$ within each group do not intersect.

The present invention additionally encompasses an apparatus comprising storage means for storing a matrix H, and a microprocessor receiving an information block $s=(s_0, \ldots, s_{k-1})$, determining parity-check bits $p=(p_0, \ldots, p_{m-1})$ based on the current symbol set $s=(s_0, \ldots, s_{k-1})$ and the matrix H, and transmitting the parity-check bits along with the current symbol set. In the preferred embodiment of the present invention H is an expansion of a base matrix $H_b$ with $H_b$ comprising a section $H_{b1}$ and a section $H_{b2}$, and $H_{b2}$ comprises column $h_b$ having weight $w_h \geq 3$ and $H'_{b2}$ having a dual-diagonal structure with matrix elements at row i, column j equal to 1 for i=j, 1 for i=j+1, and 0 elsewhere; wherein the 1's of $h_b$ and $H_{b1}$ are arranged such that one or more groups of the rows of $H_b$ can be formed so that the rows of $H_b$ within each group do not intersect.

The present invention additionally encompasses a method for operating a receiver that estimates an information block $s=(s_0, \ldots, s_{k-1})$. The method comprises the steps of receiving a signal vector, and estimating the information block $s=(s_0, \ldots, s_{k-1})$ based on the received signal vector and a parity-check matrix H. In the preferred embodiment of the present invention H is an expansion of a base matrix $H_b$ with $H_b$ comprising a section $H_{b1}$ and a section $H_{b2}$, and $H_{b2}$ comprises column $h_b$ having weight $w_h \geq 3$ and $H'_{b2}$ having a dual-diagonal structure with matrix elements at row i, column j equal to 1 for i=j, 1 for i=j+1, and 0 elsewhere; wherein 1's of $h_b$ and $H_{b1}$ are arranged such that one or more groups of the rows of $H_b$ can be formed so that rows of $H_b$ within each group do not intersect.

The present invention encompasses an apparatus comprising storage means for storing a matrix H, and a microprocessor receiving a signal vector and estimating the information block $s=(s_0, \ldots, s_{k-1})$ based on the received signal vector and the matrix H. In the preferred embodiment of the present invention H is an expansion of a base matrix $H_b$ with $H_b$ comprising a section $H_{b1}$ and a section $H_{b2}$, and $H_{b2}$ comprises column $h_b$ having weight $w_h \geq 3$ and $H'_{b2}$ having a dual-diagonal structure with matrix elements at row i, column j equal to 1 for i=j, 1 for i=j+1, and 0 elsewhere; wherein the 1's of $h_b$ and $H_{b1}$ are arranged such that one or more groups of the rows of $H_b$ can be formed so that the rows of $H_b$ within each group do not intersect.

Implementation Architecture

Figure 2:
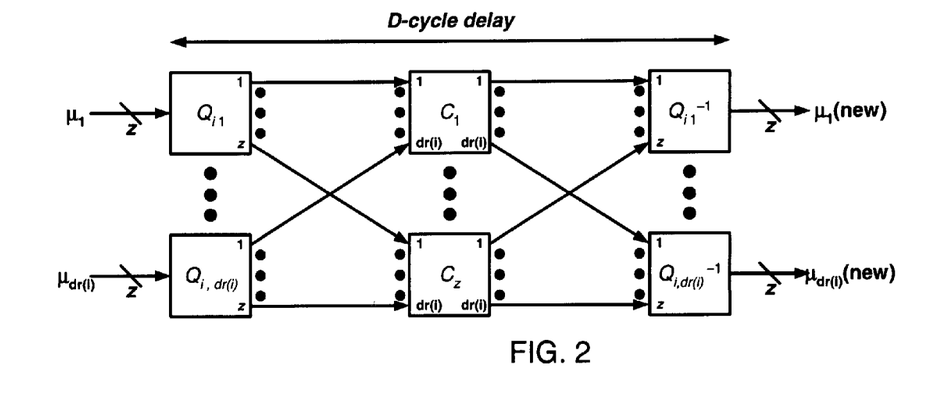
FIG. 2 is a block diagram illustrating a parity-check processing flow.

Turning now to the drawings, wherein like numerals designate like components, FIG. 2 is a block diagram illustrating a parity-check processing flow. The digital logic in the processing blocks of FIG. 2 can be entirely pipelined when the intermediate results stored by any register (processing an earlier vector row) are not needed to generate results for any previous register (processing a later vector row) in the circuit. This can be achieved through layer grouping, where the base matrix $H_b$ is constrained such that groups of base rows do not intersect, which means that the base rows within a group have at most a single 1 within a base column (or equivalently, within each group the rows of $H_{bm}$ have at most a single non-negative entry within a column). Layer grouping may further increases LDPC decoder speed through pipelining.

For a structured LDPC code with expansion factor z, the z parity checks within a vector check node (corresponding to a row of the base matrix) can be computed in parallel. This is because the code structure guarantees that the message from any given variable node within a vector variable node (corresponding to a column of the base matrix) is needed by at most one of the z parity check nodes within a vector check node. An exemplary block diagram of the parity check processing flow is provided in FIG. 2. The grouped messages $\mu_j$ from vector variable nodes to vector check node i, $1 \leq j \leq d_r(i)$, corresponding to the $d_r(i)$ non-zero entries of the i-th row of the base matrix are permuted according to the existing permutation submatrix $Q_{ij}$, $1 \leq j \leq d_r(i)$, and presented to the z parallel parity check circuits $C_l$ within vector check node i, $1 \leq l \leq z$. The parity check circuitry produces messages which are then inverse permuted to obtain the updated messages $\mu_j(new)$, which can be utilized in subsequent decoding steps. As described in the figure, once current messages are passed into the circuit, updated messages are generated D cycles later.

Given this model, consider a base matrix where for any two rows, say r and s, the sets of columns with non-trivial entries do not intersect. Thus, the vector parity check nodes corresponding to these two rows use (and update) entirely different sets of messages, which are related to two different sets of vector variable nodes. In this case, since the circuitry of FIG. 2 is pipelined, the vector parity checks for both of row r and row s can be computed in D+1 cycles. This is done by feeding the messages for row s one cycle later than for row r into a processing unit depicted in FIG. 2. If the messages for row r were fed in at time t, they will be updated at time t+D, followed by the update of row s messages at time t+D+1.

In a fully pipelined approach, the base matrix is designed so that the rows of $H_b$ can be divided into $m_b/2$ groups, where for the two rows within each group, the sets of columns with non-trivial entries do not intersect. Note that the grouped rows do not have to be consecutive because the decoder could be controlled to process the parity check matrix rows out of order. One example of a model matrix $H_{bm}$ derived from a fully pipelined type of base matrix $H_b$ is as follows:

$$\begin{bmatrix}
-1 & 94 & 73 & -1 & -1 & -1 & -1 & -1 & 55 & 83 & -1 & -1 & 7 & 0 & -1 & -1 & -1 & -1 & -1 & -1 & -1 & -1 & -1 & -1 \\
-1 & 27 & -1 & -1 & -1 & 22 & 79 & 9 & -1 & -1 & -1 & 12 & -1 & 0 & 0 & -1 & -1 & -1 & -1 & -1 & -1 & -1 & -1 & -1 \\
-1 & -1 & -1 & 24 & 22 & 81 & -1 & 33 & -1 & -1 & -1 & 0 & -1 & -1 & 0 & 0 & -1 & -1 & -1 & -1 & -1 & -1 & -1 & -1 \\
61 & -1 & 47 & -1 & -1 & -1 & -1 & -1 & 65 & 25 & -1 & -1 & -1 & -1 & 0 & 0 & -1 & -1 & -1 & -1 & -1 & -1 & -1 & -1 \\
-1 & -1 & 39 & -1 & -1 & -1 & 84 & -1 & -1 & 41 & 72 & -1 & -1 & -1 & -1 & 0 & 0 & -1 & -1 & -1 & -1 & -1 & -1 & -1 \\
-1 & -1 & -1 & -1 & 46 & 40 & -1 & 82 & -1 & -1 & -1 & 79 & 0 & -1 & -1 & -1 & -1 & 0 & 0 & -1 & -1 & -1 & -1 & -1 \\
-1 & -1 & 95 & 53 & -1 & -1 & -1 & -1 & 14 & 18 & -1 & -1 & -1 & -1 & -1 & -1 & -1 & 0 & 0 & -1 & -1 & -1 & -1 & -1 \\
-1 & 11 & 73 & -1 & -1 & -1 & 2 & -1 & -1 & 47 & -1 & -1 & -1 & -1 & -1 & -1 & -1 & -1 & 0 & 0 & -1 & -1 & -1 & -1 \\
12 & -1 & -1 & -1 & 83 & 24 & -1 & 43 & -1 & -1 & -1 & 51 & -1 & -1 & -1 & -1 & -1 & -1 & -1 & 0 & 0 & -1 & -1 & -1 \\
-1 & -1 & -1 & -1 & -1 & 94 & -1 & 59 & -1 & -1 & 70 & 72 & -1 & -1 & -1 & -1 & -1 & -1 & -1 & -1 & 0 & 0 & -1 & -1 \\
-1 & -1 & 7 & 65 & -1 & -1 & -1 & -1 & 39 & 49 & -1 & -1 & -1 & -1 & -1 & -1 & -1 & -1 & -1 & -1 & -1 & 0 & 0 & -1 \\
43 & -1 & -1 & -1 & -1 & 66 & -1 & 41 & -1 & -1 & -1 & 26 & 7 & -1 & -1 & -1 & -1 & -1 & -1 & -1 & -1 & -1 & -1 & 0
\end{bmatrix}$$

In this example, one way to form six groups of the rows of $H_{bm}$ is: {0, 2}, {4, 11}, {6, 8}, {10, 1}, {3, 5}, {7, 9}, where the rows are labeled sequentially from 0 to 11 starting from the top. In this example, all rows belong to a group, and no two groups contain the same row. In general, there are one or more groups of rows, and some rows may not be included within a group.

In the fully pipelined approach the throughput can be nearly doubled relative to the case where there are no grouped rows (which requires 2D clock cycles to process 2 rows). This is because processing of any subsequent row must be delayed until all messages on the current row being processed have been updated when row grouping cannot be formed. Therefore the fully pipelined decoding allows significant throughput increase without extra hardware cost. It can be also viewed that the fully pipelined design achieves almost the same throughput as a design that uses twice the hardware where the two vector rows within a group are decoded simultaneously on two processing units.

Alternatively, the vector rows of the parity-check matrix H can be permuted such that every two consecutive vector rows do not intersect since row permutation has no effect on decoding performance. In other words, the rows of base matrix $H_b$ can be permuted such that every two consecutive rows do not intersect. This not only requires the base matrix be designed so that the rows of $H_b$ can be divided into $m_b/2$ groups, where for the two rows within a group, the sets of columns with non-trivial entries do not intersect; but also that the last row of a previous group does not intersect with the first row of a current group. This may further increase the decoder throughput since the processing of the current group can start 1 cycle after the previous group without waiting for the previous group to finish. As $H_{bm}$ is derived from $H_b$, a non-intersecting $H_b$ will naturally produce a non-intersecting $H_{bm}$. For instance, in the example $H_{bm}$ presented above when the rows are permuted according to [0, 2, 4, 11, 6, 8, 10, 1, 3, 5, 7, 9] it can be seen that every two consecutive rows of the permuted $H_{bm}$ do not intersect.

On the other hand, a hybrid approach is possible if some rows of $H_b$ intersect. For example, some base matrix rows could be grouped with non-intersecting rows while some could remain ungrouped. In this case the rows contained within the groups cover substantially the $m_b$ rows, but not all the rows. In this case the throughput could be increased, possibly without the performance penalty of the fully pipelined approach, since the maximum column weight is limited to $m_b/2$ if fully pipelined decoding is achieved.

Another approach involves a modification of the decoding paradigm. In this case, the processing of a subsequent vector row is not delayed until all messages on the current row are updated even if the current vector row and the subsequent vector row intersect. Instead, after the messages for a first vector row are fed into the parity check circuits the messages for a second vector row are introduced at a one cycle delay. The performance of this scheme will suffer because the second vector row does not reap the benefit of any updated messages in the first vector row. It may be possible to mitigate the performance impact by reducing the intersection between pairs of vector rows (rather than to absolutely minimize it to no intersection) while achieving the desired error-correcting capability. Thus, a compromise between the error-correcting performance and the decoding speed can be reached.

A further approach involves following the standard decoding paradigm (processing all rows fully before subsequent rows are begun) on early iterations and switching to the modified decoding paradigm discussed above on later iterations.

In the discussion above, group size of q=2 is assumed. In general, the base matrix may be designed such that the $m_b$ rows of $H_b$ can be divided into $m_b/q$ groups, q>=2, where the q rows within each group do not intersect (called "q-grouping" in the following). When fully pipelined, q vector rows can be started in the pipeline consecutively, with one cycle separation between consecutive vector rows. Thus the q rows can be finished in D+q−1 cycles. Thus the throughput of q-grouping design is nearly q times as much as the design where no grouping exists since without grouping q vector rows takes D×q cycles to compute. The parity-check matrix with grouping size q has a maximum allowed column weight of $m_b/q$. Thus q should be selected properly so that good error-correcting performance can be achieved with the maximum allowed column weight.

Although in the preferred embodiment all groups uniformly have q vector rows and the circuitry is fully utilized, it is possible to design an $H_b$ where the groups do not have uniform sizes. In one example, floor($m_b/q$) groups contain q vector rows in each group, while one group contains rem ($m_b$, q) vector rows.

Although the design is discussed under the consideration of layered decoding, a parity-check matrix with q-grouping (group size q) design can be decoded using any other decoding architecture. For example, the belief propagation decoding with flooding scheduling is still applicable, where all check nodes are processed simultaneously, and all variable nodes are processed simultaneously.

Parity-check Matrix

Each of the LDPC codes is a systematic linear block code. Each LDPC code in the set of LDPC codes is defined by a matrix H of size m-by-n, where n is the length of the code and m is the number of parity check bits in the code. The number of systematic bits is k=n−m.

The matrix H is defined as an expansion of a base matrix and can be represented by $$H = \begin{bmatrix} P_{0,0} & P_{0,1} & P_{0,2} & \cdots & P_{0,n_b-2} & P_{0,n_b-1} \\ P_{1,0} & P_{1,1} & P_{1,2} & \cdots & P_{1,n_b-2} & P_{1,n_b-1} \\ P_{2,0} & P_{2,1} & P_{2,2} & \cdots & P_{2,n_b-2} & P_{2,n_b-1} \\ \vdots & \vdots & \vdots & \cdots & \vdots & \vdots \\ P_{m_b-1,0} & P_{m_b-1,1} & P_{m_b-1,2} & \cdots & P_{m_b-1,n_b-2} & P_{m_b-1,n_b-1} \end{bmatrix} = P^{H_b}$$

where $P_{i,j}$ is one of a set of z-by-z circularly column right-shifted identity matrices or a z-by-z zero matrix. The matrix H is expanded from a binary base matrix $H_b$ of size $m_b$-by-$n_b$, where n=z·$n_b$ and m=z·$m_b$, and z is a positive integer. The base matrix is expanded by replacing each 1 in the base matrix with a z-by-z right-shifted identity matrix, and each 0 with a z-by-z zero matrix. Therefore the design accommodates various packet sizes by varying the submatrix size z.

Because each permutation matrix is specified by a single circular right shift, the binary base matrix information and permutation replacement information can be combined into a single compact model matrix $H_{bm}$. The model matrix $H_{bm}$ is the same size as the binary base matrix $H_b$, with each binary entry (i,j) of the base matrix $H_b$ replaced to create the model matrix $H_{bm}$. Each 0 in $H_b$ is replaced by a negative value (e.g., by −1) to denote a z×z all-zero matrix, and each 1 in $H_b$ is replaced by a circular shift size p(i,j)≧0. The model matrix $H_{bm}$ can then be directly expanded to H.

The base matrix $H_b$ is partitioned into two sections, where $H_{b1}$ corresponds to the systematic bits and $H_{b2}$ corresponds to the parity-check bits, such that $H_b = [(H_{b1})_{m_b \times k_b} | (H_{b2})_{m_b \times m_b}]$. Section $H_{b2}$ is further partion into two sections, where column $h_b$ has odd weight $w_h>=3$, and $H'_{b2}$ has a dual-diagonal structure with matrix elements at row i, column j equal to 1 for i=j, 1 for i=j+1, and 0 elsewhere:

$$H_{b2} = [h_b | H'_{b2}] = \begin{bmatrix} h_b(0) & & 1 & & & & \\ h_b(1) & & 1 & 1 & & 0 & \\ \vdots & & & 1 & \ddots & & \\ \vdots & & & & \ddots & 1 & \\ \vdots & & & & & 1 & 1 \\ h_b(m_b-1) & & & & & & 1 \end{bmatrix}.$$

When column $h_b$ has weight $w_h=3$, one way to arrange the 1's of $h_b$ is $h_b(0)=1$, $h_b(m_b-1)=1$, and a third value $h_b(j)=1$, for some $0<j<(m_b-1)$. The base matrix structure avoids having multiple weight-1 columns in the expanded matrix.

The expansion of the base matrix $H_b$ uses identical submatrices for each of the 1's in each column of the second section $H'_{b2}$, and the expansion uses paired submatrices for an even number of 1's in $h_b$. In particular, the non-zero submatrices are circularly right shifted identity matrices with a particular circular shift value. One way to assign the shift sizes is as follows:

Each 1 in $H'_{b2}$ is assigned a shift size of 0, and is replaced by a z×z identity matrix when expanding to H.

The two 1's located at the top and the bottom of $h_b$ are assigned equal shift sizes, and the third 1 in the middle of $h_b$ is given an unpaired shift size.

The unpaired shift size in $h_b$ is equal to 0.

Encoder and Decoder Structure

Figure 3:
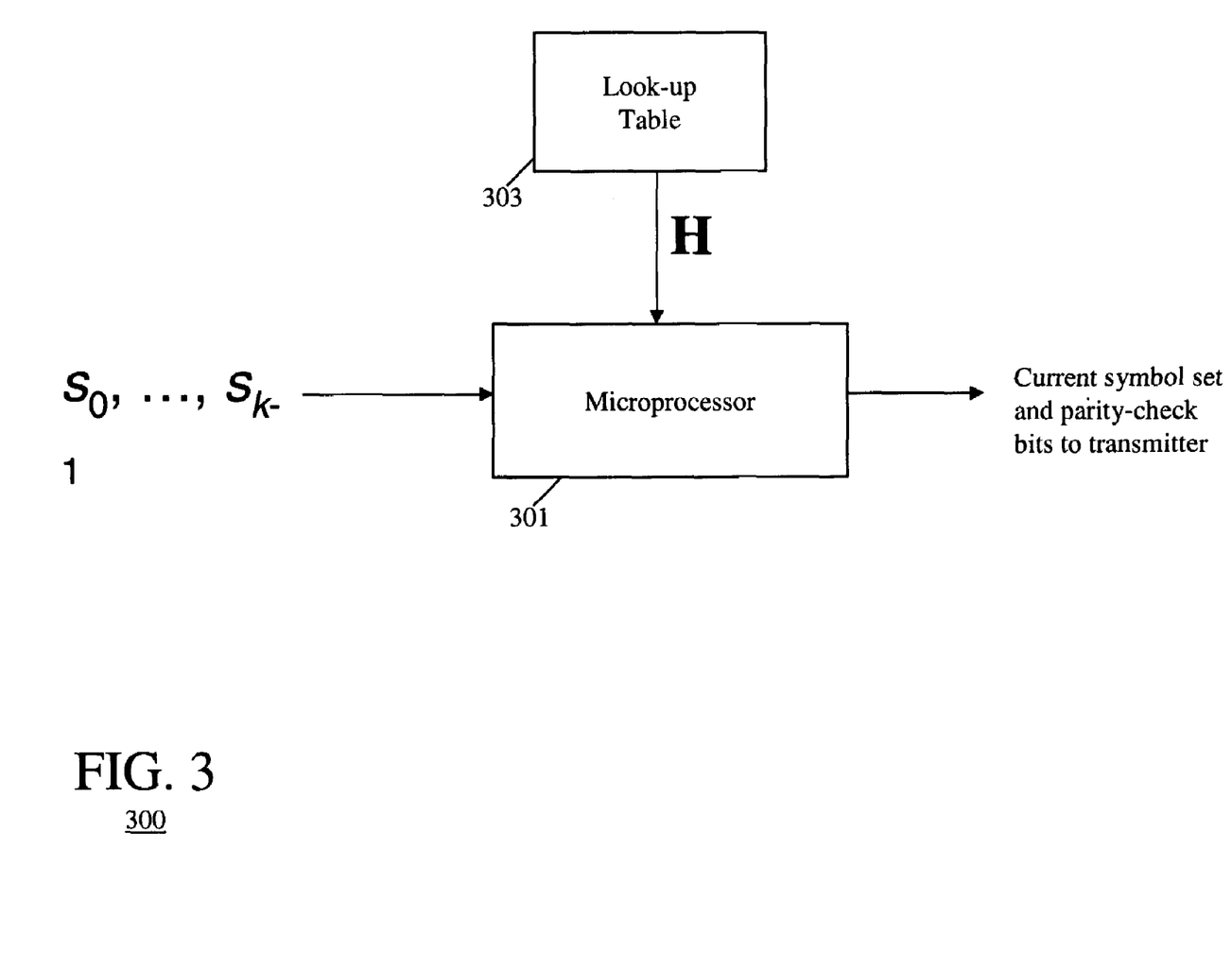
FIG. 3 is a block diagram of an encoder.

FIG. 3 is a block diagram of encoder 300. As shown, encoder 300 comprises microprocessor 301 and lookup table 303. In the first embodiment of the present invention, microprocessor 301 comprises a digital signal processor (DSP), such as, but not limited to MSC8300 and DSP56300 DSPs. Additionally, lookup table 303 serves as storage means to store a matrix, and comprises read-only memory; however, one of ordinary skill in the art will recognize that other forms of memory (e.g., random-access memory, magnetic storage memory, etc.) may be utilized as well. In a second embodiment, the functionality of the microprocessor 301 and the lookup table 303 can be incorporated into an application specific integrated circuit (ASIC) or field programmable gate array (FPGA). In particular, the lookup table 303 can be implemented in a form of memory corresponding to the existence or non-existence of signal paths in a circuit.

As discussed above, encoded data is generally output as a plurality of parity-check bits in addition to the systematic bits, where together the parity-check and systematic bits form a codeword x. In the first embodiment of the present invention, a parity-check matrix H is stored in lookup table 303, and is accessed by microprocessor 301 to solve Equation (1). In particular, microprocessor 301 determines appropriate values for the parity-check bits $p=(p_0, \ldots, p_{m-1})$ based on the current symbol set $s=(s_0, \ldots, s_{k-1})$ and the parity-check matrix H. The parity-check bits and the symbol set are then passed to a transmitter and transmitted to a receiver.

In the present case, H can be compactly-represented by a model matrix $H_{bm}$, which in turn is derived from a base matrix $H_b$. In the present case, the base matrix $H_b$ is partitioned into two sections, where $H_{b1}$ corresponds to the systematic bits and $H_{b2}$ corresponds to the parity-check bits, such that $H_b = [(H_{b1})_{m_b \times k_b} | (H_{b2})_{m_b \times m_b}]$. The parity portion $H_{b2}$ has the format $$H_{b2} = [h_b | H'_{b2}] = \begin{bmatrix} h_b(0) & 1 & & & & \\ h_b(1) & 1 & 1 & & 0 & \\ \vdots & & 1 & \ddots & & \\ \vdots & & & \ddots & 1 & \\ \vdots & & 0 & & 1 & 1 \\ h_b(m_b-1) & & & & & 1 \end{bmatrix}$$

where the column $h_b$ has weight $w_h \geq 3$. The 1's of $h_b$ and $H_{b1}$ are arranged such that $m_b/q$ groups of the rows of $H_b$ can be formed, where the q rows of $H_b$ within each group do not intersect. In one example, group j contains rows with index $g(j)=\{j, j+m_b/q, j+2 \times m_b/q, \ldots, j+(q-1) \times m_b/q\}$, $j=0, 1, \ldots, (m_b/q-1), m_b/q > 1$. In this case, if $w_h=3$, one example of column $h_b$ contains three non-zero entries $h_b(0)=1$, $h_b(m_b-1)=1$, and $h_b(a)=1$, where $a \notin g(0)$, $a \notin g(m_b/q-1)$.

In some systems, different base matrices may be needed. The non-intersecting construction described may be used for a subset of all base matrices. For example, if three base matrices with the same number of columns are needed for R=½, ⅔, and ¾. Then the non-intersecting construction may be used for R=½ and ⅔, but not used for R=¾ to maintain a good performance.

Figure 4:
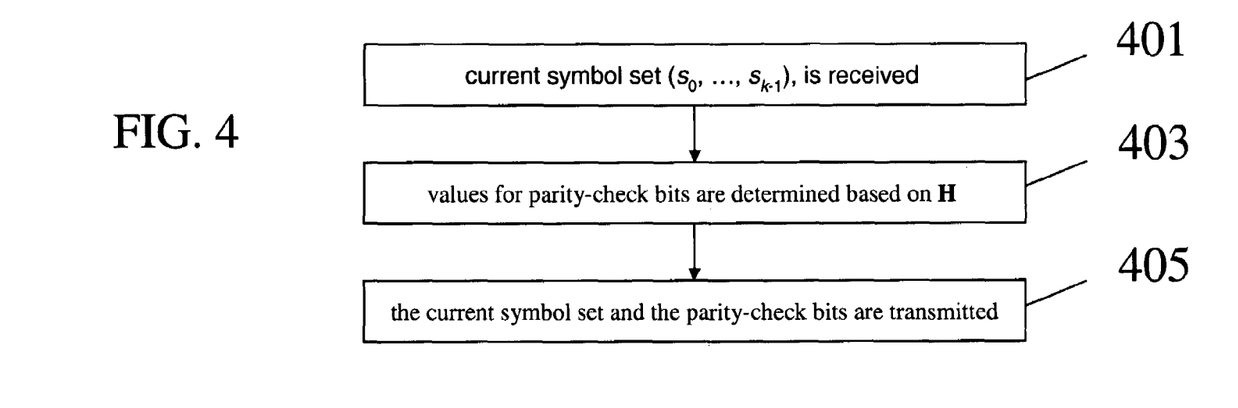
FIG. 4 is a flow chart showing the operation of the encoder of FIG. 3.

FIG. 4 is a flow chart showing the operation of encoder 300, and in particular, microprocessor 301. The logic flow begins at step 401 where a current symbol set $(s_0, \ldots, s_{k-1})$ is received by microprocessor 301. At step 403, values of parity-check bits are determined based on the current symbol set and H. In particular, the parity-check bits $(p_0, \ldots, p_{m-1})$ are determined to satisfy $Hx^T = 0^T$. Column $h_b$ of $H_b$ has weight $w_h \geq 3$; section $H'_{b2}$ has a dual-diagonal structure with matrix elements at row i, column j equal to 1 for i=j, 1 for i=j+1, and 0 elsewhere. The 1's of $h_b$ and $H_{b1}$ are arranged such that $m_b/q$ groups of the rows of $H_b$ can be formed. The q rows of $H_b$ within each group do not intersect. In other words, the q rows of $H_b$ within each group do not have positive values in the same column. In addition, base matrix $H_b$ may be further constrained such that the rows of $H_b$ can be permuted such that every two consecutive rows do not intersect. At step 405 the current symbol set and the parity-check bits are transmitted via over-the-air transmission.

Figure 5:
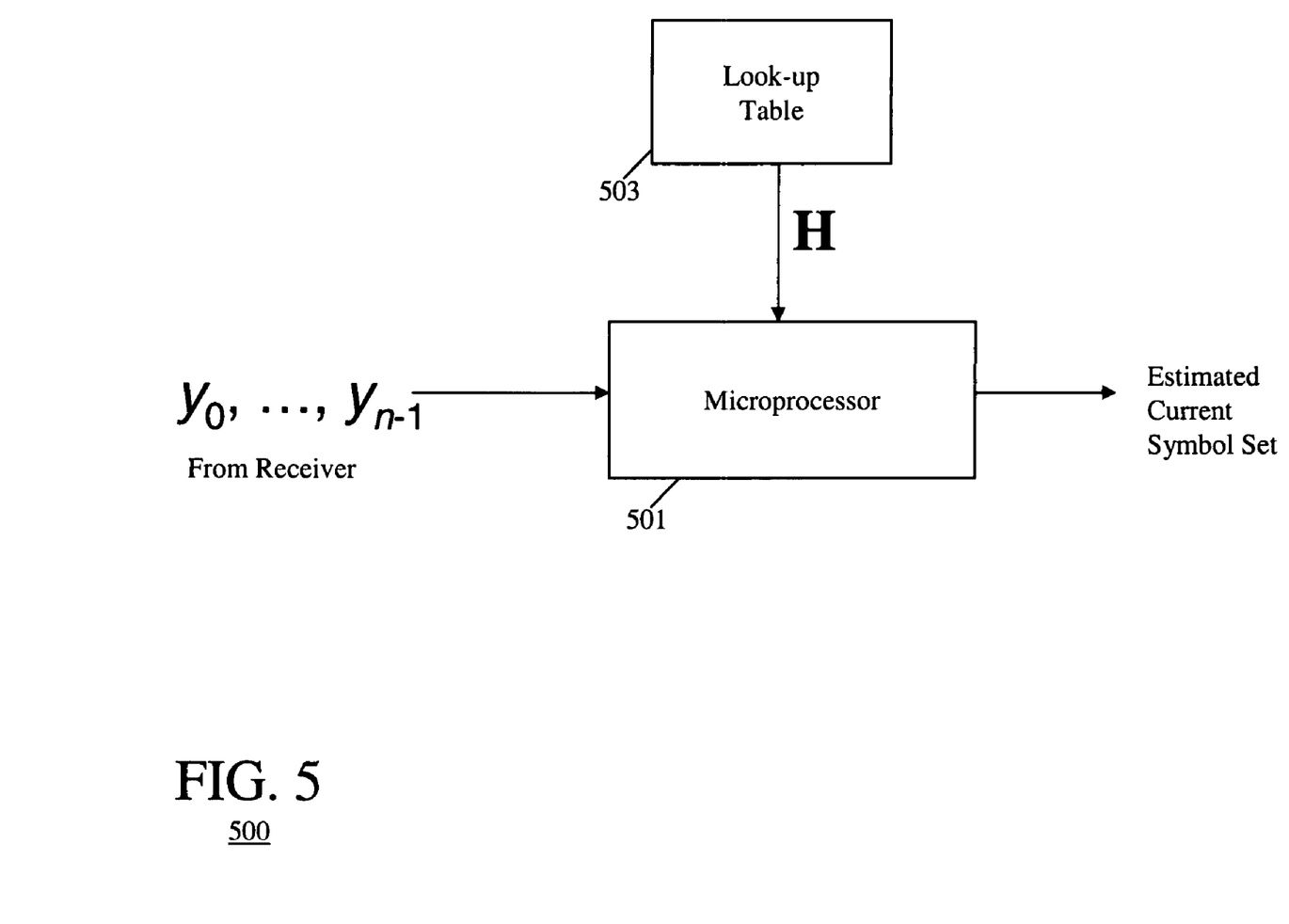
FIG. 5 is a block diagram of a decoder.

FIG. 5 is a block diagram of decoder 500. As shown, decoder 500 comprises microprocessor 501 and lookup table 503. In a first embodiment of the present invention, microprocessor 501 comprises a digital signal processor (DSP), such as, but not limited to MSC8300 and DSP56300 DSPs. Additionally, lookup table 503 acts as storage means for storing matrix H, and comprises read-only memory. However, one of ordinary skill in the art will recognize that other forms of memory (e.g., random-access memory, magnetic storage memory, etc.) may be utilized as well. In a second embodiment, the functionality of the microprocessor 501 and the lookup table 503 can be incorporated into an application specific integrated circuit (ASIC) or field programmable gate array (FPGA). In particular, the lookup table 503 can be implemented in a form of memory corresponding to the existence or non-existence of signal paths in a circuit.

The received signal vector (received via a receiver) $y = (y_0, \ldots, y_{n-1})$ corresponds to the codeword x transmitted through a noisy channel, where the encoded data x, as discussed above, is a codeword vector. In the first embodiment of the present invention, a parity-check matrix H is stored in lookup table 503, and is accessed by microprocessor 501 to decode y and estimate the current symbol set s (i.e., the current symbol set $(s_0, \ldots, s_{k-1})$). In particular, microprocessor 501 estimates the current symbol set $(s_0, \ldots, s_{k-1})$ based on the received signal vector $y = (y_0, \ldots, y_{n-1})$ and the parity-check matrix H.

As is well known in the art, there are many ways the decoder 500 can use the parity-check matrix H in the microprocessor 501 for decoding. One such way is to perform a vector-matrix multiplication with H to determine a likely error pattern. Another such way is to use H to construct a bipartite graph where the edges in the graph correspond to 1's in H, and to iteratively process y on the bipartite graph.

Figure 6:
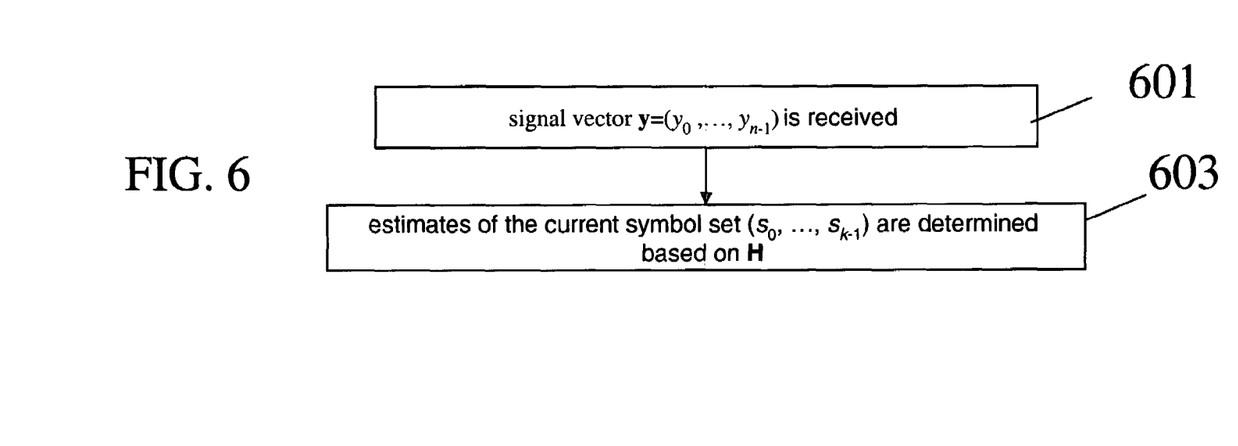
FIG. 6 is a flow chart showing the operation of the decoder of FIG. 4.

FIG. 6 is a flow chart showing the operation of decoder 500, and in particular, microprocessor 501. The logic flow begins at step 601 where the received signal vector $y = (y_0, \ldots, y_{n-1})$ is received. At step 603, estimates of the current symbol set s (i.e., the current symbol set $(s_0, \ldots, s_{k-1})$) are determined based on H. As discussed, the base matrix $H_b$ of H comprises column $h_b$ having weight $w_h \geq 3$, and section $H'_{b2}$ having a dual-diagonal structure with matrix elements at row i, column j equal to 1 for i=j, 1 for i=j+1, and 0 elsewhere. The 1's of $H_b$ are arranged such that $m_b/q$ groups of rows of $H_b$ can be formed. The q rows of $H_b$ within each group do not intersect. In other words, the q rows of $H_b$ within each group do not have positive values in the same column.

While the invention has been particularly shown and described with reference to a particular embodiment, it will be understood by those skilled in the art that various changes in form and details may be made therein without departing from the spirit and scope of the invention. For example, $$\begin{bmatrix} -1 & 94 & 73 & -1 & -1 & -1 & -1 & -1 & 55 & 83 & -1 & -1 & 7 & 0 & -1 & -1 & -1 & -1 & -1 & -1 & -1 & -1 & -1 & -1 \\ -1 & 27 & -1 & -1 & -1 & 22 & 79 & 9 & -1 & -1 & -1 & 12 & -1 & 0 & 0 & -1 & -1 & -1 & -1 & -1 & -1 & -1 & -1 & -1 \\ -1 & -1 & -1 & 24 & 22 & 81 & -1 & 33 & -1 & -1 & -1 & 0 & -1 & -1 & 0 & 0 & -1 & -1 & -1 & -1 & -1 & -1 & -1 & -1 \\ 61 & -1 & 47 & -1 & -1 & -1 & -1 & -1 & 65 & 25 & -1 & -1 & -1 & -1 & -1 & 0 & 0 & -1 & -1 & -1 & -1 & -1 & -1 & -1 \\ -1 & -1 & 39 & -1 & -1 & -1 & 84 & -1 & -1 & 41 & 72 & -1 & -1 & -1 & -1 & -1 & 0 & 0 & -1 & -1 & -1 & -1 & -1 & -1 \\ -1 & -1 & -1 & -1 & 46 & 40 & -1 & 82 & -1 & -1 & -1 & 79 & 0 & -1 & -1 & -1 & -1 & 0 & 0 & -1 & -1 & -1 & -1 & -1 \\ -1 & -1 & 95 & 53 & -1 & -1 & -1 & -1 & 14 & 18 & -1 & -1 & -1 & -1 & -1 & -1 & -1 & -1 & 0 & 0 & -1 & -1 & -1 & -1 \\ -1 & 11 & 73 & -1 & -1 & -1 & 2 & -1 & -1 & 47 & -1 & -1 & -1 & -1 & -1 & -1 & -1 & -1 & -1 & 0 & 0 & -1 & -1 & -1 \\ 12 & -1 & -1 & -1 & 83 & 24 & -1 & 43 & -1 & -1 & -1 & 51 & -1 & -1 & -1 & -1 & -1 & -1 & -1 & -1 & 0 & 0 & -1 & -1 \\ -1 & -1 & -1 & -1 & -1 & 94 & -1 & 59 & -1 & -1 & 70 & 72 & -1 & -1 & -1 & -1 & -1 & -1 & -1 & -1 & -1 & 0 & 0 & -1 \\ -1 & -1 & 7 & 65 & -1 & -1 & -1 & -1 & 39 & 49 & -1 & -1 & -1 & -1 & -1 & -1 & -1 & -1 & -1 & -1 & -1 & -1 & 0 & 0 \\ 43 & -1 & -1 & -1 & -1 & 66 & -1 & 41 & -1 & -1 & -1 & 26 & 7 & -1 & -1 & -1 & -1 & -1 & -1 & -1 & -1 & -1 & -1 & 0 \end{bmatrix}$$

while the invention has been shown with the ordering of $s_i$ and $p_i$ within x defined, one of ordinary skill in the art will recognize that other ordering of the bits within x can occur since the codeword bits can be collected in any order as long as the columns of H are reordered accordingly. Additionally, while the above-description has been particularly shown and described with reference to binary codes (i.e., codes defined over the Galois Field GF(2)), one of ordinary skill in the art will recognize that an arbitrary GF may be utilized as well. Although the examples given above are shown in one format, other formats are possible which allow similar encoding and decoding procedure. For example, the rows of H may be permuted without affecting the value of the parity-check bits. In another example, the modified dual-diagonal structure shown for the entire section $H_{b2}$ may be used for a subset of the parity-check bits. In yet another example, additional steps may be performed when expanding the base matrix to the expanded matrix. The matrix H may also be used in any type of decoder that relies upon a parity-check matrix. It is intended that such changes come within the scope of the following claims.

What is claimed is:

1. A method for operating a transmitter that generates parity-check bits $p=(p_0, \ldots, p_{m-1})$ based on a current symbol set $s=(s_0, \ldots, s_{k-1})$, the method comprising the steps of:
   receiving the current symbol set $s=(s_0, \ldots, s_{k-1})$;
   using a matrix H to determine the parity-check bits; and
   transmitting the parity-check bits along with the current symbol set;
   wherein H is an expansion of a base matrix $H_b$ via a model matrix $H_{bm}$, wherein $H_b$ comprises $m_b$ rows, a section $H_{b1}$ and a section $H_{b2}$, and $H_{b2}$ comprises column $h_b$ having weight $w_h \geq 3$ and $H'_{b2}$ having a dual-diagonal structure with matrix elements at row i, column j equal to 1 for i=j, 1 for i=j+1, and 0 elsewhere; and
   wherein 1's of $h_b$ and $H_{b1}$ are arranged such that one or more groups of the rows of $H_{bm}$ can be formed so that rows of $H_{bm}$ within each group do not intersect.

2. The method of claim 1 wherein rows within the one or more groups are substantially the $m_b$ rows.

3. The method of claim 1 wherein there are $m_b/q$ groups of the rows of $H_{bm}$ each group having q rows.

4. The method of claim 1 further comprising the step of using $H_{bm}$ to determine the parity-check bits, wherein $H_{bm}$ is derived from $H_b$ with 1's in $H_b$ replaced by non-negative integers that represent shift sizes and with 0's in $H_b$ replaced by −1, and $H_{bm}$ comprises 5. The method of claim 1 wherein the rows of model matrix $H_{bm}$ can be permuted such that every two consecutive rows do not intersect.

6. The method of claim 5 wherein a row permutation of [0, 2, 4, 11, 6, 8, 10, 1, 3, 5, 7, 9] is used on matrix $H_{bm}$ when $m_b=12$.

7. The method of claim 1 wherein the plurality of groups do not have uniform sizes.

8. The method of claim 1 wherein when expanding the base matrix $H_b$ to parity-check matrix H, identical submatrices are used for each of the 1's in each column of $H'_{b2}$, and the expansion uses paired submatrices for an even number of 1's in $h_b$.

9. The method of claim 8 where the submatrices are z×z shifted identity matrices.

10. An apparatus comprising:
    storage means for storing a matrix H; and
    a microprocessor receiving an information block $s=(s_0, \ldots, s_{k-1})$, determining parity-check bits $p=(p_0, \ldots, p_{m-1})$ based on the current symbol set $s=(s_0, \ldots, s_{k-1})$ and the matrix H, and transmitting the parity-check bits along with the current symbol set;
    wherein H is an expansion of a base matrix $H_b$ via a model matrix $H_{bm}$, with $H_b$ comprising a section $H_{b1}$ and a section $H_{b2}$, and $H_{b2}$ comprises column $h_b$ having weight $w_h \geq 3$ and $H'_{b2}$ having a dual-diagonal structure with matrix elements at row i, column j equal to 1 for i=j, 1 for i=j+1, and 0 elsewhere; wherein the 1's of $h_b$ and $H_{b1}$ are arranged such that one or more groups of the rows of $H_{bm}$ can be formed so that the rows of $H_{bm}$ within each group do not intersect.

11. The apparatus of claim 10 wherein rows of model matrix $H_{bm}$ can be permuted such that every two consecutive rows do not intersect.

12. The apparatus of claim 10 wherein the one or more groups do not have uniform sizes.

13. The apparatus of claim 10 wherein when expanding the base matrix $H_b$ to parity-check matrix H, identical submatrices are used for each of the 1's in each column of $H'_{b2}$, and the expansion uses paired submatrices for an even number of 1's in $h_b$.

14. The apparatus of claim 13 where the submatrices are z×z shifted identity matrices.

15. A method for operating a receiver that estimates an information block $s=(s_0, \ldots, s_{k-1})$, the method comprising the steps of:

receiving a signal vector;

estimating the information block $s=(s_0, \ldots, s_{k-1})$ based on the received signal vector and a parity-check matrix H;

wherein H is an expansion of a base matrix $H_b$ via a model matrix $H_{bm}$, with $H_b$ comprising a section $H_{b1}$ and a section $H_{b2}$, and $H_{b2}$ comprises column $h_b$ having weight $w_h >= 3$ and $H'_{b2}$ having a dual-diagonal structure with matrix elements at row i, column j equal to 1 for i=j, 1 for i=j+1, and 0 elsewhere; wherein 1's of $h_b$ and $H_{b1}$ are arranged such that one or more groups of the rows of $H_{bm}$ can be formed so that rows of $H_{bm}$ within each group do not intersect.

16. The method of claim 15 wherein rows of the model matrix $H_{bm}$ can be permuted such that every two consecutive rows do not intersect.

17. The method of claim 15 wherein the one or more groups do not have uniform sizes.

18. The method of claim 15 wherein when expanding the base matrix $H_b$ to parity-check matrix H, identical submatrices are used for each of the 1's in each column of $H'_{b2}$, and the expansion uses paired submatrices for an even number of 1's in $h_b$.

19. An apparatus comprising:

storage means for storing a matrix H; and a microprocessor receiving a signal vector and estimating the information block $s=(s_0, \ldots, s_{k-1})$ based on the received signal vector and the matrix H;

wherein H is an expansion of a base matrix $H_b$ via a model matrix $H_{bm}$, with $H_b$ comprising a section $H_{b1}$ and a section $H_{b2}$, and $H_{b2}$ comprises column $h_b$ having weight $w_h >= 3$ and $H'_{b2}$ having a dual-diagonal structure with matrix elements at row i, column j equal to 1 for i=j, 1 for i=j+1, and 0 elsewhere; wherein the 1's of $h_b$ and $H_{b1}$ are arranged such that one or more groups of the rows of $H_{bm}$ can be formed so that the rows of $H_{bm}$ within each group do not intersect.

20. The apparatus of claim 19 wherein the rows of model matrix $H_{bm}$ can be permuted such that every two consecutive rows do not intersect.

\* \* \* \* \*

UNITED STATES PATENT AND TRADEMARK OFFICE
CERTIFICATE OF CORRECTION

PATENT NO. : 7,343,548 B2
APPLICATION NO. : 11/108949
DATED : March 11, 2008
INVENTOR(S) : Yufee W. Blankenship et al.

It is certified that error appears in the above-identified patent and that said Letters Patent is hereby corrected as shown below:

In Column 8, Line 35, delete "partion" and insert -- partitioned --, therefor.

Signed and Sealed this

Twenty-third Day of June, 2009

JOHN DOLL
*Acting Director of the United States Patent and Trademark Office*